United States Patent
McCormick et al.

(10) Patent No.: US 6,936,131 B2
(45) Date of Patent: Aug. 30, 2005

(54) ENCAPSULATION OF ORGANIC ELECTRONIC DEVICES USING ADSORBENT LOADED ADHESIVES

(75) Inventors: Fred B. McCormick, Maplewood, MN (US); Paul F. Baude, Maplewood, MN (US); Michael A. Haase, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 308 days.

(21) Appl. No.: 10/061,851

(22) Filed: Jan. 31, 2002

(65) Prior Publication Data

US 2003/0143423 A1 Jul. 31, 2003

(51) Int. Cl.[7] .......................... B32B 33/00; H05B 33/04
(52) U.S. Cl. ...................... 156/292; 428/690; 428/917; 428/68; 428/76; 428/355 R; 313/512; 257/100; 427/66
(58) Field of Search .................. 428/690, 917, 428/68, 76, 355 R; 313/512, 506, 511; 257/100; 156/292; 427/66, 58

(56) References Cited

U.S. PATENT DOCUMENTS

| | | |
|---|---|---|
| 4,829,213 A | 5/1989 | Pecile et al. |
| 5,061,549 A | 10/1991 | Shores |
| 5,112,882 A | 5/1992 | Babu et al. |
| 5,239,228 A | 8/1993 | Taniguchi et al. |
| 5,244,707 A | 9/1993 | Shores |
| 5,304,419 A | 4/1994 | Shores |
| 5,362,421 A | 11/1994 | Kropp et al. |
| 5,401,536 A | 3/1995 | Shores |
| 5,591,379 A | 1/1997 | Shores |
| 5,672,400 A | 9/1997 | Hansen et al. |
| 5,686,360 A | 11/1997 | Harvey, III et al. |
| 5,744,557 A | 4/1998 | McCormick et al. |
| 5,874,804 A | 2/1999 | Rogers |
| 6,081,071 A | 6/2000 | Rogers |
| 6,103,141 A | 8/2000 | Incorvia et al. |
| 2002/0146533 A1 * | 10/2002 | Chung et al. .................. 428/76 |
| 2003/0080677 A1 * | 5/2003 | Mikhael et al. ............. 313/504 |

FOREIGN PATENT DOCUMENTS

| | | |
|---|---|---|
| EP | 0 577 276 B1 | 8/1997 |
| EP | 1 021 070 A1 | 7/2000 |
| JP | 95169567 | 7/1995 |
| JP | 08124677 | 5/1996 |
| JP | 2000 030857 | 1/2000 |
| JP | 00123968 | 4/2000 |
| JP | 2000150141 A | 5/2000 |
| JP | 2000-208251 * | 7/2000 |
| JP | 2000 306664 | 11/2000 |
| JP | 2000311782 | 11/2000 |
| WO | WO 97/43352 | 11/1997 |
| WO | WO 00/06663 | 2/2000 |
| WO | WO 02/05361 A1 | 1/2002 |

* cited by examiner

*Primary Examiner*—Dawn L. Garrett

(57) ABSTRACT

Disclosed herein are organic electronic devices that are encapsulated at least in part by adsorbent-loaded transfer adhesives. The adsorbent material may be a dessicant and/or a getterer. The adsorbent-loaded transfer adhesive may form a gasket around the periphery of the device, or may cover the entire device and its periphery. An encapsulating lid covers the device.

11 Claims, 2 Drawing Sheets

ENCAPSULATION OF ORGANIC ELECTRONIC DEVICES USING ADSORBENT LOADED ADHESIVES

TECHNICAL FIELD

This invention relates to encapsulated organic electronic devices.

BACKGROUND

Organic electronic devices (OEDs) are articles that include layers of organic materials, at least one of which can conduct an electric current. Illustrative examples of known OED constructions include organic transistors, photovoltaic devices, rectifiers, and organic light emitting diodes (OLEDs). Heat, light, oxygen, and moisture adversely affect many of the inorganic materials, such as low work function electrodes, and the organic materials that are used in OEDs. It is important, therefore, to protect these materials from exposure to the open air. OED devices thus require hermetic packaging in order to achieve the long lifetimes required for many applications. For an OLED, this typically consists of attaching a glass or metal cap onto the cathode side of the device, as described in, e.g., U.S. Pat. Nos. 5,874,804 and 5,686,360, respectively. As described in, e.g., JP 00123968, desiccants are often placed inside the hermetically sealed device to absorb moisture that may be generated by the cure of the adhesive or that may enter the device through adhesive bond line. Oxygen getterers may also be placed inside the sealed device to absorb any oxygen that may enter the device through the sealing adhesive, as described in, e.g., U.S. Pat. Nos. 5,304,419 and 5,591,379; and JP 07-169567. Typical desiccants include fine powders of BaO or CaO. Typical oxygen getterers include finely divided metals such as magnesium and iron. Care must be taken to prevent these fine powders from contacting the OLED to avoid abrasion damage, electrical shorting, and the like. The desiccant and/or getterer is thus often placed in a dimple in the metal or glass sealing cap and held in place by a permeable membrane.

Desiccants have also been dispersed into organic polymers to give composite materials with some adsorbent properties. These loaded polymers have been coated on the inside of encapsulation caps or adhered to the inside of encapsulation caps as a means of preventing the desiccant from physically damaging the package it is designed to protect, as described in JP 00-150141 and WO 00/06663. These desiccant loaded adhesives have generally not been used to structurally bond two parts together.

SUMMARY OF INVENTION

The present invention recognizes the need for effective, easy-to-apply adhesive sealants containing adsorbent materials. The present invention features the use of adsorbent (desiccant and/or getterer) loaded transfer adhesives to adhere an encapsulation lid to an organic electronic device (OED) as part of an encapsulation method. The adsorbent loaded transfer adhesives function as a structural adhesive to hold the encapsulating lid in place as well as providing a means to absorb oxygen and/or moisture.

One aspect of the present invention provides a method of encapsulating an organic electronic device comprising: providing an adsorbent loaded transfer adhesive containing one or both of a dessicant and a gettering material, applying the transfer adhesive such that it will form a gasket around the entire periphery of an organic electronic device situated on a substrate or will cover the entire device, and applying a lid over the organic electronic device and its periphery such that the lid is adhered to the substrate by the adhesive, thereby encapsulating the device. The device may be an organic light emitting diode.

Another aspect of the invention provides an article comprising an encapsulated organic electronic device comprising: an organic electronic device on a substrate, an adsorbent loaded transfer adhesive that forms a perimeter seal around the device and optionally further forms a layer covering the device, the adsorbent loaded adhesive containing one or both of a dessicant and a gettering material, and a lid over the device, wherein the transfer adhesive adheres the lid to the substrate.

The transfer adhesive may be first applied to the lid instead of the substrate or device. The transfer adhesive is made from a material selected from the group comprising hot melt adhesives, pressure sensitive adhesives, thermoset adhesives, UV curable adhesives, curable pressure sensitive adhesives, and combinations thereof and the transfer adhesive may be cured as part of the process.

The organic electronic device may be on a rigid or flexible substrate. The flexible substrate may be a continuous web. The lid may be selected from the group comprising stamped metal foils, glass plates, plastic circuit boards, ceramic cans, machined metal cans, and semiconductor substrates.

A high barrier adhesive may be applied around the entire periphery of the portion of transfer adhesive that is adhering the lid to the substrate. The high barrier adhesive may be selected from the group comprising two part epoxies, solvent based adhesives, one part curable adhesives, and UV curable adhesives. When a high barrier adhesive is used, the transfer adhesive can comprise an adhesive that is permeable to one or both of air and water vapor.

As used in this invention:
"high barrier adhesive" means an adhesive that has low permeability to oxygen and/or water vapor without being loaded with any dessicant or getterer,
"transfer adhesive" means a preformed adhesive layer that can be used to bond two surfaces together; examples include an adhesive film on a release liner, a free-standing adhesive film, and adhesive layers on both sides of a carrier film.

An advantage of at least one embodiment of the present invention is that the desiccant and/or getterer are at a critical location in the device to enhance its ability to prevent moisture and/or oxygen induced OED degradation.

Another advantage of at least one embodiment of the present invention is that it simplifies the encapsulation process because only one step is needed to seal the device and provide an adsorbent material.

Another advantage of at least one embodiment of the present invention is that the transfer adhesive could be laminated to a device or sealing film. This aspect is compatible with flexible devices and roll-to-roll processing.

Another advantage of at least one embodiment of the present invention is that it provides an adsorbent-loaded adhesive proximate the OED device and a high barrier adhesive that seals the adsorbent-loaded adhesive from the atmosphere.

Another advantage of at least one embodiment of the present invention is that the adsorbent-loaded transfer adhesive acts as a dam to prevent liquid adhesive (such as those used to form a high barrier seal), or volatile, corrosive, or solvent materials in the liquid adhesive, from reaching the OED if such an adhesive is used as a supplemental edge sealant. This allows the use of adhesives for edge seals that could not be used otherwise.

Other features and advantages of the invention will be apparent from the following drawings, detailed description, and claims.

DETAILED DESCRIPTION

The present invention can provide a robust OED device by providing a sealing and adsorbing medium around an OED, which protects the OED device from water vapor and other gases. Using an adsorbent and/or getterer loaded transfer adhesive for encapsulation can improve the performance of such OEDs as organic transistors, photovoltaic devices, rectifiers, and organic light emitting diodes (OLEDs).

Transfer adhesives provide many advantages over liquid adhesives. They are more easily handled and can be laminated to a device, sealing film, or encapsulation lid. They also make it easier to control the shape, size, and position of the adhesive layer. With regard to processing advantages, they can be die cut and pre-applied to a lid or substrate.

Organic light emitting diodes (OLEDs), sometimes referred to as lamps, are a type of OED desirable for use in electronic media because of their thin profile, low weight, capability of obtaining a wide variety of emission colors, and low driving voltage, i.e., less than about 20 volts. OLEDs have potential use in applications such as backlighting of graphics, pixelated displays, and large emissive graphics. However, OLEDs are susceptible to degradation by water vapor and other gases such as oxygen and volatile organics.

OLEDs typically consist of an emissive organic element sandwiched between two electrodes: a cathode and an anode. If water vapor enters the device, it can cause dark spots due to cathode corrosion and/or delamination.

Suitable OLED substrates include glass, transparent plastics such as polyolefins, polyethersulfones, polycarbonates, polyesters, polyarylates, and polymeric multilayer films, ITO coated barrier films, surface-treated films, and selected polyimides. It is highly desirable for the OLED substrate to have barrier properties matching those of theencapsulation lid. Flexible rolls of glass may also be used as a substrate or a lid. Such a material may be laminated to a polymer carrier for better structural integrity. It is further desirable that the sides, i.e., edges, of the OLED have barrier and/or adsorbent properties that offer commensurate protection.

Figure 1A:
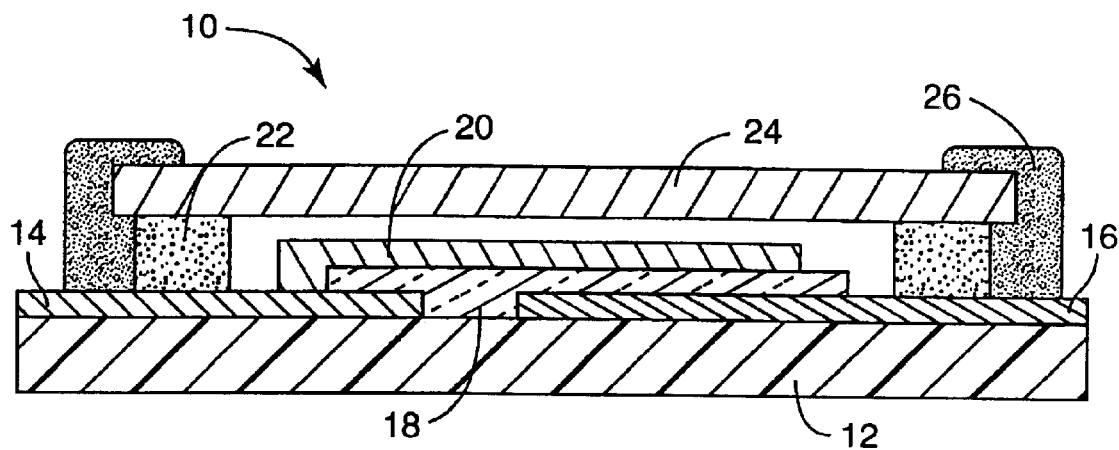
FIGS. 1A (cross section) and 1B (top view) depict an OLED packaged by a two-stage encapsulation method using a gasket-like transfer adhesive.
Figure 1B:
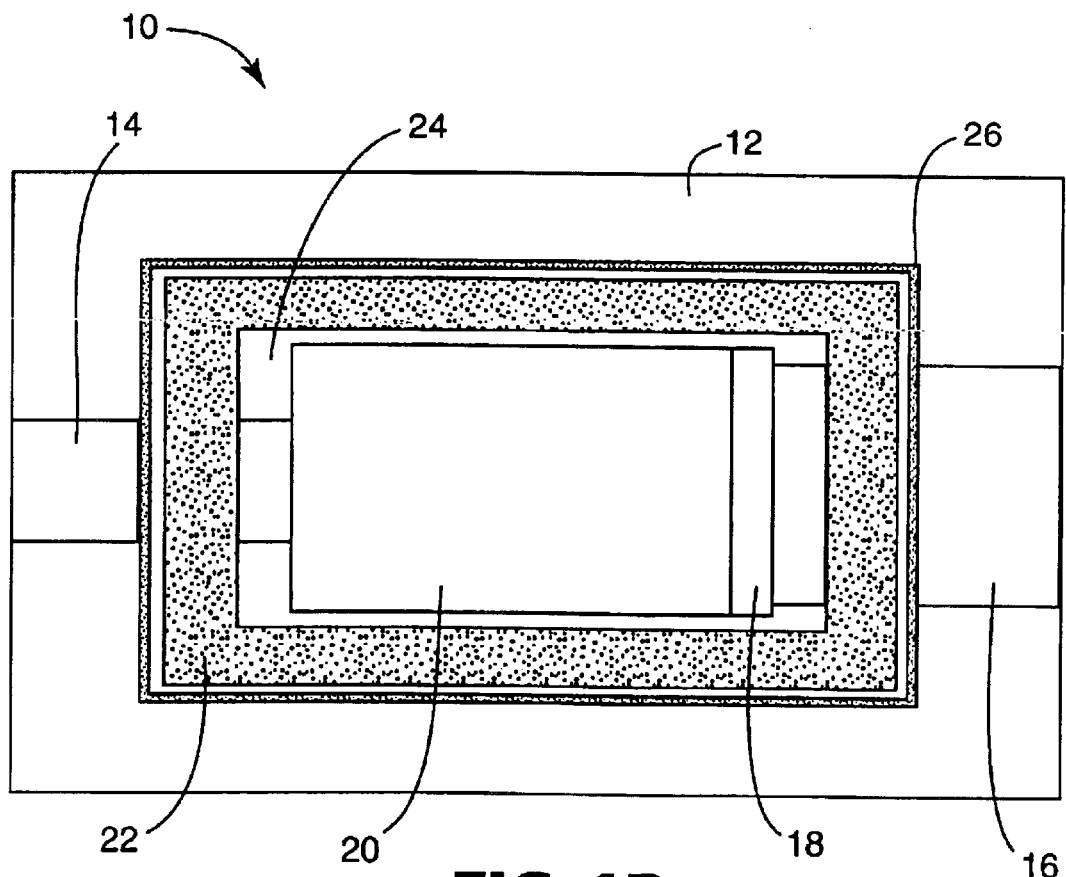
Figure 2A:
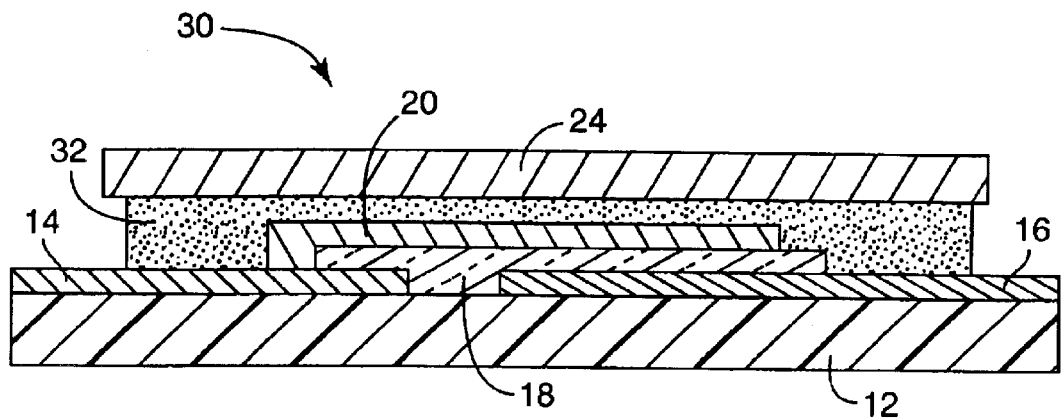
FIGS. 2A (cross section) and 2B (top view) depict an OLED encapsulated with a continuous transfer adhesive layer.
Figure 2B:
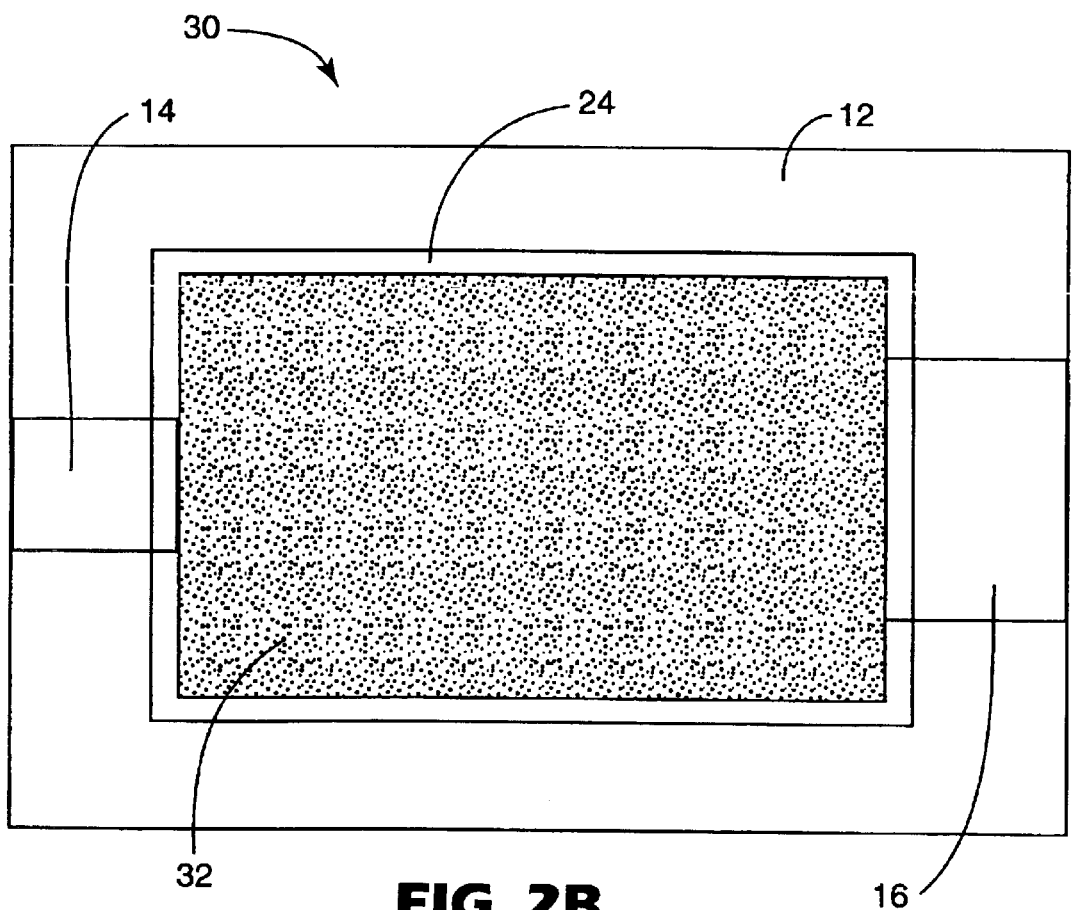

Articles of the present invention include various encapsulation constructions. For example, the adsorbent loaded transfer adhesive may form a gasket that surrounds the periphery of an OED and adheres the encapsulation lid to the substrate, as illustrated in FIG. 1. Alternatively, the adsorbent loaded transfer adhesive may form a continuous layer between the OED and an encapsulation lid that also adheres the encapsulation lid to the substrate, as illustrated in FIG. 2. In making an encapsulated structure, the transfer adhesive may be applied to the substrate/device structure or may be applied to the encapsulating lid before these two components are joined together. Suitable encapsulation lids may be made of metals, glass, ceramics, or plastics, for example, stamped metal foils, plastic circuit boards, ceramic cans, glass plates, machined metal cans, and semiconductor substrates. The lid may be transparent or opaque, depending on the desired construction of the OED.

Device 10 of FIG. 1 is comprised of substrate 12 on which are located cathode pad 14 and anode pad 16. Organic emissive element 18 contacts both cathode pad 14 and anode pad 16. Cathode 20 contacts emissive element 18 and cathode pad 14. Desiccant-loaded transfer adhesive 22 forms a gasket around the OED structure covering its periphery, and is topped with encapsulation lid 24. Optional high barrier adhesive 26 encompasses transfer adhesive 22 and extends from substrate 12 to encapsulation lid 24.

Device 30 of FIG. 2 is comprised of substrate 12 on which are located cathode pad 14 and anode pad 16. Organic emissive element 18 contacts both cathode pad 14 and anode pad 16. Cathode 20 contacts emissive element 18 and cathode pad 14. Desiccant-loaded transfer adhesive 32 covers the entire OED structure and its periphery, and is topped with encapsulation lid 24. An optional high barrier adhesive (not shown) can encompass transfer adhesive 32 and extend from substrate 12 to encapsulation lid 24.

The adsorbent loaded transfer adhesives suitable for the present invention may be made of pressure sensitive adhesives, hot melt adhesives, thermoset adhesives, actinic radiation curable adhesives (such as UV and visible light curable), electron beam curable adhesives, curable pressure sensitive adhesives, or various combinations thereof. The transfer adhesives are already in film form prior to being applied to the OED structure. The transfer adhesive may comprise a carrier film having adhesive coated on both sides, as in a double-sided adhesive tape; a free-standing film; or an adhesive layer on a removable liner.

The transfer adhesives may be made by any suitable method known in the art to create an adhesive film layer such as extrusion, hot pressing, solvent coating, and 100% solids radiation cured coating.

Examples of materials suitable for making the transfer adhesive include pressure sensitive adhesives (PSA) made from acrylates such as Ultra-Clean Laminating Adhesive 501FL and Optically Clear Laminating Adhesive 8141 both available from 3M Bonding Systems Division, St. Paul, Minn., rubbers such as KRATON styrenic block copolymers from Shell Chemicals, Houston, Tex., silicones such as RHODOTAK 343 from Rhodia Silicones, Lyon, France, and polyolefins such as poly(1-hexene), poly(1-octene), and poly(4-ethyl-1-octene) described in U.S. Pat. No. 5,112,882; hot melt adhesives such as unloaded versions of the tackified polyamide-polyether copolymers described in U.S. Pat. No. 5,672,400 and the thermoplastic polymer adhesive films described in U.S. Pat. No. 5,061,549; curable adhesives, thermosets, and crosslinking systems such as the unloaded versions of the epoxy/thermoplastic blends described in U.S. Pat. No. 5,362,421; the cyanate ester/ethylenically unsaturated semi-IPNs described in U.S. Pat. No. 5,744,557; and the epoxy/acrylate compositions described in WO 97/43352. Various combinations of pressure sensitive adhesive, hot melt, and curable adhesives may be useful in the practice of the invention.

Once the transfer adhesive is made, it is cut into a suitable shape, e.g., by die cutting or other suitable means, and may then be applied to the OED structure. If the transfer adhesive is cut into a gasket shape it is applied around the exterior of the OED structure. If the transfer adhesive shape is a continuous layer, it may be applied directly onto the OED structure, so that it covers the structure and its periphery. The encapsulating lid is then applied to the device and transfer adhesive thereby sealing the device. The lid is preferentially applied in an oxygen- and/or moisture-free environment, such as dry $N_2$ gas, to prevent trapping undesirable atmospheric components adjacent to the OED. Heat, pressure, and actinic radiation may be used to provide a complete seal, and if appropriate, cure the transfer adhesive. Alternatively, the transfer adhesive may be applied to the encapsulation lid instead of the OED/substrate structure, then the lid is applied onto the OED structure (adhesive side down). A high barrier adhesive may then be applied around the periphery of the encapsulation lid, if desired, to provide further protection from the atmosphere and additional bonding of the lid to the substrate.

It should be recognized that the ability of desiccants and getterers to absorb moisture and oxygen is related to the ease with which moisture and oxygen can contact the desiccants and getterers. When dispersed in an adhesive matrix that has good barrier properties, the desiccants and getterers will be less accessible than when dispersed in an adhesive matrix that is oxygen and moisture permeable. However, when the adhesive has good oxygen and moisture barrier properties, it may be sufficient to use the adsorbent loaded adhesive as the sole encapsulating adhesive. In the practice of this invention, one may balance the barrier properties of the adhesive with the accessibility of the desiccants and getterers. This allows for a broader selection of adhesives that can be used. For example, an adhesive with unacceptably low barrier properties may be structurally desirable. To overcome the low barrier properties, dessicants and/or getterers may be added to the adhesive.

Examples of suitable desiccants include dehydrated metal halides, salts, silicates, oxides, hydroxides, halides, sulphates, perchlorates, carbonates, and activated carbon. Specific examples include cobalt chloride, calcium chloride, calcium bromide, lithium chloride, zinc chloride, zinc bromide, silicon dioxide (silica gel), aluminum oxide (activated alumina), calcium sulfate, copper sulfate, potassium carbonate, magnesium carbonate, titanium dioxide, bentonite, acidic clay, montmorillonite, diatomaceous earth (clay mineral) silica alumina, zeolite, silica, zirconia, activated carbon, and alkaline earth oxides such as barium oxide, calcium oxide, iron oxide, and magnesium oxide.

Desiccant loaded materials such as DESIMAX SLF Hot Melt films available from Multisorb Technologies Inc., Buffalo, N.Y. are also suitable for use in the present invention. The dessicant is typically CaO.

Examples of suitable getterers include finely divided metals such as Al, Fe, Mg, and Mn.

Typically, it is desirable to load the adhesive with as much dessicant and/or getterer as possible without compromising the adhesion of the adhesive to the substrate and lid. Suitable ranges of for the dessicant and/or getterer are about 5 to about 95 wt %, preferably about 10 to about 70 wt %, more preferably about 15 to about 50 wt %. It is also desirable that the dessicant and/or getterer are as fine as possible, i.e., the individual particles are as small as possible. This allows for more efficient loading and reduces the likelihood of the bond line adhesion failing.

The thickness or width of the transfer adhesive layer will typically range from about 0.005 to about 5 mm, more typically about 0.01 to about 2 mm, and most typically about 0.025 to about 0.5 mm. The optimum thickness will depend on factors such as the size of the article, the adhesive being used, dessicant and/or getterer being used, and the architecture and end use of the OED.

The use of a two-staged encapsulation scheme can optimize the accessibility of the desiccants and getterers while maintaining a high barrier encapsulation seal around the OED. FIGS. 1(A & B) shows a cross section (1A) and top view (1B) of an OLED packaged with a two-stage encapsulation scheme. In the first stage, an encapsulation lid is attached to the cathode side of the OLED using an adsorbent loaded transfer adhesive. In FIG. 1, this transfer adhesive is located around the periphery of the device, much like a gasket, but the transfer adhesive could cover the entire area under the encapsulation lid (as shown in FIG. 2). Desiccant and getterer may be dispersed together in the transfer adhesive. Alternatively, a desiccant loaded transfer adhesive and a getterer loaded transfer adhesive may be used independently or in combination, e.g., in concentric gaskets or stacked layers. The adsorbent loaded transfer adhesive structurally bonds the encapsulation lid to the device to protect it from the ambient atmosphere at least until the second encapsulation stage can be completed. In the second stage, a fillet or bead of high barrier adhesive, typically a liquid, is placed around the edges of the encapsulating lid thereby hermetically sealing the device. The high barrier adhesive usually requires a curing or drying step. In this approach, the exterior barrier adhesive can block atmospheric moisture and air from reaching the device while the desiccant/getterer is readily accessible to the OED device, thereby maximizing its effectiveness as an adsorbent material. The adsorbent-loaded transfer adhesive is fully contained within the interior of the encapsulation chamber defined by the substrate, encapsulating lid, and the high barrier adhesive. Thus the properties of the individual adhesive elements may be maximized for their intended purpose. In addition, the transfer adhesive protects the OED from detrimental effects of liquid high barrier adhesives such as solvents, volatile organics, liquid adhesive contacting the cathode, and water resulting from curing the high barrier adhesive. Alternatively, the adsorbent loaded transfer adhesive may be formulated to allow cross-linking of the periphery of the adhesive after joining the lid and substrate, such as by irradiating the periphery with actinic radiation. The resulting cross-linking reduces permeability to atmospheric moisture and air, and activation by actinic radiation may be used to increase bonding between the adhesive and lid and substrate.

If the transfer adhesive adheres well to the substrate and lid, the high barrier adhesive may not be necessary. However, if the adhesion is poor, channels allowing water vapor and oxygen infusion could be formed. The second stage high barrier adhesive would eliminate this problem.

Suitable high barrier adhesives include two part epoxies such as ARALDITE 2011 and 2014 from Ciba Specialty Chemicals, Brewster, N.Y., Scotch-Weld™ DP-100 and DP-270 Potting Compound/Adhesives, and Scotchcast™ Electrical Resin 8 from 3M Company, St. Paul, Minn.; solvent based adhesives such as 3M Super Strength Adhesive Cat. No. 6004 from 3M Company; one part curable adhesives such as Superflex™ Clear RTV silicone adhesive sealant from Loctite Corporation, Rocky Hill, Conn. and CA-8 Cyanoacrylate Adhesive from 3M Company; UV curable adhesives such as the Series 3100 adhesives from Three Bond of America, Inc., Torrance, Calif., UV15-7 from Master Bond, Inc., Hackensack, N.J., and Epotek OG142 from Epoxy Technology, Billerica, Mass.

EXAMPLES

This invention may be illustrated by way of the following examples.

Example 1

This example describes the making of an OLED with a gasket-like adsorbent-loaded adhesive layer. FIG. 1 is an illustration of an OLED device made as described in this example.

A 2"×3" indium tin oxide (ITO), coated glass slide, available from Thin Film Devices, Long Beach, Calif., was etched to form a simple pattern of two ITO pads (electrodes) with a small (1–3 mm) gap in between. The etching took place in a heated hydrochloric acid bath (about 60° C.) and the masking was accomplished using a commercially available plating tape. Following completion of the etching, the tape was removed and the unetched portion of the ITO on glass was cleaned using a methanol rub and oxygen plasma exposure. A thin film of poly(ethylenedioxythiophene) (PEDOT) (available as product number 4083 from Bayer, Pittsburgh, Pa.) was deposited on the surface by spin coating (not shown in FIG. 1). The PEDOT coated ITO on glass was baked on a hotplate at about 100° C. for about 5–10 minutes.

After the bake step the sample was fitted into a shadow mask, to provide for a shadowed cathode contact, and placed into a vacuum deposition system. The following films were deposited by thermal evaporation onto the surface of the above construction at a pressure of about $10^{-5}$ torr:

| Material | Thickness (Å) | Deposition Rate (Å/sec) |
|---|---|---|
| copper phthalocyanine (CuPc) | 100 | 1 |
| 4,4'-bis(naphthalene-2-yl)-N,N'-diphenyl benzidine (α-NPD) | 200 | 1 |
| Tris(8-hydroxyquinolinolato) aluminum (Alq3): coumarin dye (C545T available from Kodak, Rochester, NY) | 200 | 1:0.01 |
| Alq3 | 150 | 1 |
| Lithium Fluoride (LiF) | 10 | 1 |
| Aluminum | 4000 | 10–30 |

The organic materials listed in the table were obtained from H.W. Sands, Jupiter, FL, unless otherwise indicated.

The organic materials were deposited at an angle from one side of the OLED device and the LiF and metals were deposited at an angle from the other side of the OLED device. This provided for an organic emissive layer that spanned both the cathode pad and anode, and a cathode that contacted the cathode pad without contacting the anode. (See FIG. 1) Upon completion of the thin film stack deposition the resulting unencapsulated OLED sample was removed from the vacuum system and immediately introduced into a nitrogen glove box. A thin (0.2 mm) glass slide was used as the encapsulating lid. It was placed on a hotplate in the nitrogen glove box and heated to about 130° C.

An adhesive sheet about 1 mm thick, which had been made by hot pressing a desiccant loaded hotmelt adhesive (DesiMax SLF, loaded with CaO) between release liners, was cut into a gasket-like shape to provide a perimeter seal for the OLED device. The resulting gasket-shaped adhesive was placed on top of the hot encapsulating lid, and began to soften and develop a wet appearance after about 3–5 minutes. Following this change, the OLED lamp was placed cathode side down onto the desiccant loaded adhesive. While still on the hotplate, the sandwiched construction was then pressed together to ensure a complete seal between the OLED device and the encapsulating lid. The encapsulated device was then removed from the hotplate and allowed to cool thereby firmly adhering the device to the encapsulation lid.

The encapsulated lamp was then removed from the glove box and allowed to sit in atmospheric conditions alongside un-encapsulated lamps, i.e., having no encapsulating lids. During this time the lamps were not operated. Periodically the lamps (both encapsulated and un-encapsulated) were operated to observe their degradation (dark spot formation). The un-encapsulated lamps failed quite readily and formed dark spots within 24 hours. It should be noted that the rate of degradation depends, in part, on the relative humidity in the laboratory and this changes daily. However, lamps that were encapsulated using the desiccant loaded hotmelt consistently showed no presence of dark spots. Furthermore, encapsulated lamps introduced into a high relative humidity environment (R.H.>94%) also did not show any dark spot development.

Example 2

This example describes the making of an OLED with a continuous adsorbent-loaded adhesive layer. FIG. 2 is an illustration of an OLED device made as described in this example.

An unencapsulated OLED device was made in the same manner as described in Example 1. Also as in Example 1, upon completion of the thin film stack deposition the sample was removed from the vacuum system and immediately introduced into a nitrogen glove box. A thin (0.2 mm) glass slide was used as the encapsulating lid. It was placed on a hotplate in the nitrogen glove box and heated to about 130° C.

A rectangular piece of the dessicant loaded hotmelt adhesive film of Example 1 was cut out with scissors to fit directly over (and almost entirely cover) the thin glass encapsulating lid. The resulting adhesive piece was placed on top of the hot encapsulating lid, began to soften and develop a wet appearance after about 3–5 minutes. Following this change, the OLED lamp was placed cathode side down onto the desiccant loaded adhesive. While still on the hotplate, the sandwiched construction was then pressed together to ensure a complete seal between the OLED device and the encapsulating lid. The encapsulated device was then removed from the hotplate and allowed to cool.

The encapsulated lamp was then removed from the glove box and allowed to sit in atmospheric conditions alongside un-encapsulated lamps, i.e., having no encapsulating lids. During this time the lamps were not operated. Periodically the lamps (both encapsulated and un-encapsulated) were operated to observe their degradation (dark spot formation). The un-encapsulated lamps failed quite readily and formed dark spots within 24 hours. It should be noted that the rate of degradation depends, in part, on the relative humidity in the laboratory and this changes daily. However, lamps that were encapsulated using the desiccant loaded adhesive consistently showed no presence of dark spots. Furthermore, encapsulated lamps introduced into a high relative humidity environment (R.H.>94%) also did not show any dark spot development.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description.

What is claimed is:

1. A method of encapsulating an organic electronic device comprising:

providing an adsorbent loaded transfer adhesive film containing one or both of a desiccant and a gettering material, applying the film such that it will form a gasket around the entire periphery of an organic electronic device situated on a substrate or will cover the entire device, and applying a lid over the organic electronic device and its periphery such that the lid is adhered to the substrate by the adhesive, thereby encapsulating the device.

2. The method of claim 1 wherein the film is first applied to the lid instead of the substrate or device.

3. The method of claim 1 wherein the film is made from a material selected from the group comprising hot melt adhesives, pressure sensitive adhesives, thermoset adhesives, UV curable adhesives, curable pressure sensitive adhesives, and combinations thereof.

4. The method of claim 1 further comprising curing the adhesive film.

5. The method of claim 1 wherein the organic electronic device is on a rigid substrate.

6. The method of claim 1 wherein the organic electronic device is on a flexible substrate.

7. The method of claim 6 wherein the flexible substrate is a continuous web.

8. The method of claim 1 wherein the device is an organic light emitting diode.

9. The method of claim 1 further comprising applying a high barrier adhesive around the entire periphery of the portion of transfer adhesive that is adhering the lid to the substrate.

10. The method of claim 9 wherein the high barrier adhesive is selected from the group consisting of two part epoxies, solvent based adhesives, one part curable adhesives, and UV curable adhesives.

11. The method of claim 9 wherein the film comprises an adhesive that is permeable to one or both of air and water vapor.

* * * * *